(12) United States Patent
Whitehead et al.

(10) Patent No.: US 7,272,201 B2
(45) Date of Patent: Sep. 18, 2007

(54) SYSTEM FOR SYNCHRONOUS SAMPLING AND TIME-OF-DAY CLOCKING USING AN ENCODED TIME SIGNAL

(75) Inventors: David E. Whitehead, Pullman, WA (US); Gregory C. Zweigle, Pullman, WA (US); David J. Casebolt, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 657 days.

(21) Appl. No.: 10/645,418

(22) Filed: Aug. 20, 2003

(65) Prior Publication Data
US 2005/0041767 A1 Feb. 24, 2005

(51) Int. Cl.
*H04L 7/00* (2006.01)
(52) U.S. Cl. ........................ 375/355; 375/376
(58) Field of Classification Search ........ 375/354–355, 375/376–377; 327/24, 141, 147, 151, 156; 341/126, 155; 368/46–47
See application file for complete search history.

(56) References Cited

U.S. PATENT DOCUMENTS

| | | | | |
|---|---|---|---|---|
| 4,535,306 A | * | 8/1985 | Yamaguchi et al. | 331/23 |
| 4,546,486 A | * | 10/1985 | Evans | 375/374 |
| 4,808,884 A | * | 2/1989 | Hull et al. | 375/376 |
| 5,103,466 A | * | 4/1992 | Bazes | 375/361 |
| 5,235,590 A | * | 8/1993 | Taguchi et al. | 369/59.2 |
| 5,793,869 A | | 8/1998 | Claflin | |
| 6,456,831 B1 | * | 9/2002 | Tada | 455/180.3 |
| 6,678,134 B2 | | 1/2004 | Benenson | |
| 6,754,210 B1 | | 6/2004 | Ofek | |
| 6,859,742 B2 | * | 2/2005 | Randall et al. | 702/61 |
| 6,891,441 B2 | * | 5/2005 | Rochow | 331/1 A |
| 6,937,683 B1 | * | 8/2005 | Ratzel | 375/376 |
| 2001/0023464 A1 | | 9/2001 | Deck | |

FOREIGN PATENT DOCUMENTS

| | | |
|---|---|---|
| GB | 2278519 | 11/1994 |
| JP | 10247377 | 9/1998 |
| WO | WO-00/16525 | 3/2000 |
| WO | WO-00/57527 | 9/2000 |

OTHER PUBLICATIONS

US Army RCC, IRIG Serial Time Code Formats, IRIG Standard 200-98, May 1998.
Brandywine Communications, User Guide GPS Time and Frequency System Model GPS8 Plus, Oct. 2004.
IEEE, IEEE Standard for Synchrophasors for Power Systems, IEEE Std 1344-1995, May 27, 1996.

* cited by examiner

*Primary Examiner*—Jean B. Corrielus
(74) *Attorney, Agent, or Firm*—Cook, Alex, McFarron, Manzo, Cummings & Mehler, Ltd.

(57) ABSTRACT

The system for synchronous sampling uses an encoded time signal, such as an IRIG-B signal. The IRIG-B signal is applied to an edge detector, which produces pulses based on the edges of the encoded time signal. These signals are applied to a phase-locked-loop assembly which is arranged to produce an output sampling synchronization signal which is locked to the transitions in the encoded time signal, providing a synchronous control signal for data sampling of input signals to a plurality of electronic instruments, in addition to the use of the IRIG-B signal as time-of-day clock synchronization for the plurality of instruments.

13 Claims, 2 Drawing Sheets

US 7,272,201 B2

SYSTEM FOR SYNCHRONOUS SAMPLING AND TIME-OF-DAY CLOCKING USING AN ENCODED TIME SIGNAL

TECHNICAL FIELD

This invention relates generally to electronic instruments which sample analog input signals to produce corresponding digital signals, and more specifically concerns synchronization of the sampling function in a plurality of such instruments.

BACKGROUND OF THE INVENTION

Various electronic instruments, including, for example, protective relays for power systems and electricity meters, sample analog input signals by means of an analog-to-digital converter to produce digital signals which are then processed to produce specific information from the input signals which relates to the function of the instrument. Appropriate action is taken, relative to the instrument, as needed, in response to that information. For instance, in a protective relay, if the information from the input signals indicates a fault on the power line, the instrument may trip the current breaker for that portion of the line.

In certain situations/system arrangements, it is important that sampling of the analog input signals be made simultaneously by multiple instruments, again for instance, simultaneous sampling of line voltage and current input signals in a plurality of protective relays. This presents a challenge when the instruments are not all located in close physical proximity. A number of solutions concerning the synchronous sampling of inputs to multiple electronic instruments, however, are known. One such system uses a repeating time pulse, derived from the Global Positioning System.

Many of the electronic instruments which utilize sampling functions also have a time-of-day clock and calendar which the instrument uses to time-tag particular reports or other information which the instrument generates. One example of such a report is an oscillograph report from a power system protective relay; another example is a revenue report from an electricity meter. It is important that the time-of-day clocks in the multiple devices are synchronized to all report the same time, at the same instant, on time. Many current devices use an encoded time-of-day signal, such as an IRIG-B signal, to synchronize their time-of-day internal clocks.

As presently configured, most such instruments use two control signals to accomplish desired synchronization, one control source being a periodic pulse by which each device synchronizes its sampling of input signals to be measured, and the other being a nonperiodic encoded time-of-day signal to which the device synchronizes its time-of-day clock.

While the use of two separate control signals has proved to be workable, it is desirable to have a single control signal to synchronize both data sampling (or other periodic action) and the time-of-day clock in electronic instruments.

SUMMARY OF THE INVENTION

Accordingly, the present invention is a system for synchronous sampling of analog signal inputs for a plurality of electronic instruments, using an encoded time signal, comprising: an externally generated encoded time signal provided to the plurality of electronic instruments suitable for insuring accurate time-of-day clock synchronization for the electronic instruments; an edge detector responsive to the encoded time signal to produce a series of pulses based on the edges of the encoded time signal; and a phase-locked loop assembly producing an output sampling synchronization signal which is phase-locked to said pulses at the output of the edge detector, such that the output sampling synchronization signal occurs at the beginning of each predetermined time period with successive synchronization signals being evenly spaced in the interval between the beginning of each successive predetermined time, for synchronization of data sampling in said plurality of instruments.

BEST MODE FOR CARRYING OUT THE INVENTION

In the present invention, an encoded time-of-day signal, such as an IRIG-B signal, which is currently used to synchronize the time-of-day clocks in a plurality of electronic instruments, is also used to produce sampling synchronization signals for the same plurality of instruments, instead of having two separate synchronization signals, one for sampling and the other for time of day. Although the embodiment described concerns sampling signals, it should be understood that the encoded time of day signal could be used for synchronization of other instrument operations, including for instance synchronization of various test procedures and communication procedures, among others.

In the described embodiment of the present system, the encoded time-of-day signal is an IRIG-B (U.S. Army IRIG standard 200-89). However, it should be understood that the present invention is not limited to an IRIG-B signal; rather, any encoded time signal which can be used to synchronize time clocks in a plurality of electronic instruments can be used to produce a synchronous data sampling signal as well.

Figure 1A:
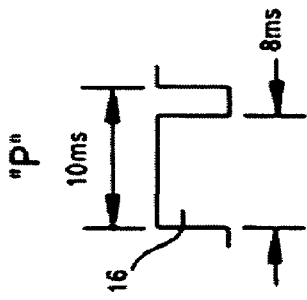
FIGS. 1A-1C show the encoding of an IRIG-B time signal.
Figure 1B:
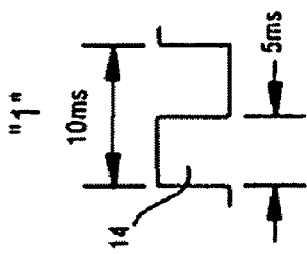
Figure 1C:
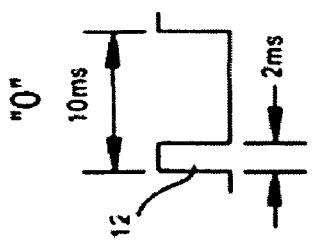
Figure 2:
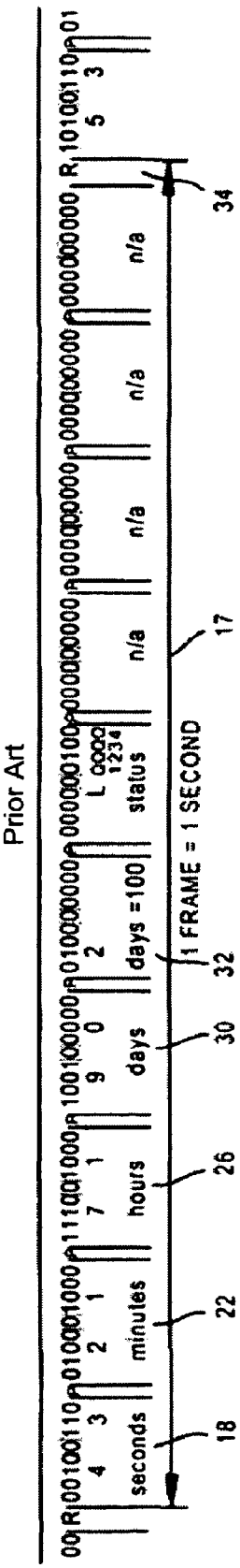
FIG. 2 is a diagram showing a complete IRIG-B signal frame representing one second of time of day.

A conventional IRIG-B time signal, using pulse width modulation to encode information concerning the time of day is shown in FIGS. 1A-1C. In a 10-millisecond bit, a binary coded digit is encoded as a zero (pulse width of 2 milliseconds) shown at 12 or a one (pulse width of 5 milliseconds) shown at 14. Each IRIG-B complete frame (a single frame is shown in FIG. 2) represents one second in time. Separate frames are provided for each successive second. Each IRIG-B frame is separated by two successive 'P" bits from the next successive frame, each 'P" bit having an 8-millisecond pulse (shown at 16) out of the 10-millisecond bit.

FIG. 2 shows how the IRIG signal is transmitted, as a series of ones and zeros as set forth above, providing an indication of seconds, minutes, hours, days (0-99) and hundreds of days (0-3). The IRIG-B information is transmitted simultaneously to a plurality of instruments (e.g. a plurality of protective relays for a power system) operating in synchronization. The IRIG-B signal sets the time-of-day clock in each of the devices so that the time of day is the same in each of the plurality of devices in a particular system.

In FIG. 2, the complete IRIG-B transmission identifying one particular second in a year is shown at 17. The encoding for seconds is designated at 18, minutes at 22, hours at 26, 0-99 days at 30, and hundreds of days at 32. The particular second identified is the 34th 35th second, of the 12th minute, of the 17th hour, of the 209th day. An "R" field 34, comprising two successive "P" bits, separates successive frames. In the present invention, the IRIG-B encoded time signal or other encoded time signal is also used for its conventional time-of-day clock synchronization of a plurality of devices. However, it is also used to produce a data sampling (or other function) synchronization signal for the same devices.

Figure 3:
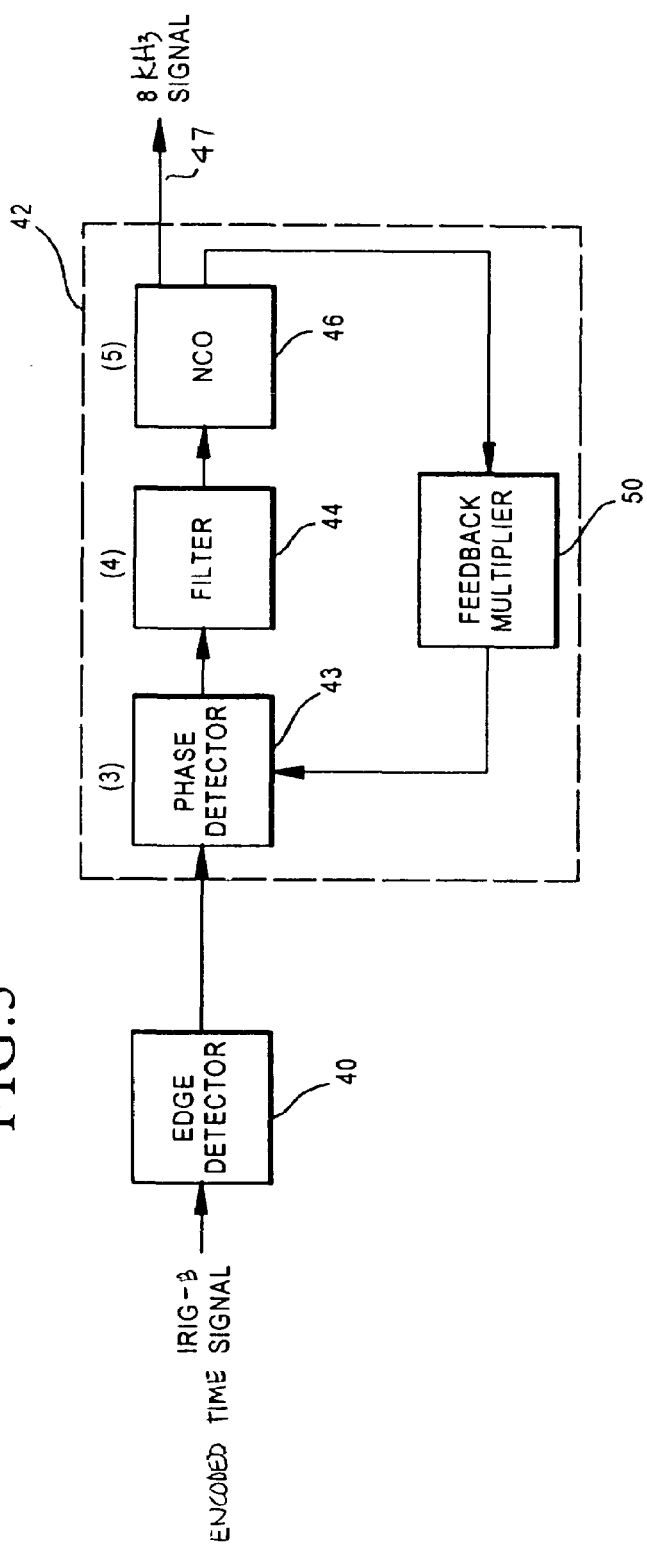
FIG. 3 is a block diagram showing the system of the present invention using an encoded time signal to produce a sampling synchronization signal.

Referring to FIG. 3, the IRIG-B time-encoded signal is first applied to a conventional edge detector 40. The edge detector 40 will produce a pulse whenever an edge (rising or falling) of the IRIG-B signal is detected. p1 Referring again to FIG. 1, the time between successive edges of the IRIG-B signal could be 2, 5 or 8 milliseconds, based on a 10-millisecond bit. Thus, the output of the edge detector 40 will be a series of pulses, separated by 2, 5 or 8 milliseconds. Each edge will be a multiple of 1 kHz away from the last edge. The output of the edge detector 40 is applied to a phase-locked-loop 42 which is arranged to produce an output signal of selected frequency, 8 kHz in the embodiment shown, phase-locked to the pulses from the edge detector. Since the transitions of the output signal from the phase-locked-loop occur simultaneously with transitions in the RIG-B signal input, a data sampling synchronization signal occurs precisely at the beginning of each second, as defined by the RIG-B input signal, in particular, the rising edge of the second "P" b it in the "R" field 34. The 8 kHz output signal on line 47 is the data sampling synchronization signal for the plurality of synchronized devices.

The phase-locked-loop 42 includes a phase detector 43 which is responsive to the output of the edge detector 40 and a feedback circuit from the output of the phase-locked-loop to determine whether there is any phase difference between the two signals. If there is no phase difference, then the two signals are exactly in phase, and the output of the phase detector is zero. If there is a difference, then the output of the phase detector is some number representative of the phase difference. This output is supplied to a filter 44, the purpose of which is to reduce jitter in the signal from the phase detector. In the embodiment shown, this is a divide by 32 circuit. For example, if a count of 100 is provided at the input to the filter 44, a count of three is provided at the output.

The output of the filter controls a numerically controlled oscillator (NCO) 46, which is designed to produce an output signal (line 47) of selected frequency, i.e. 8 kHz in this particular embodiment. It could, however, be other integral multiples of 1 kJ-Iz, including 1 kI-Iz, 2 ldIz, 3 kHz, etc. The NCO in operation counts nominally to the output frequency, which in the embodiment shown is 8 kHz. The count is adjusted by the output of filter (+/−); the adjustment allows the system to lock to the incoming signal. The output of counter 46 is applied to the feedback circuit 50 for the phase-locked-loop. The feedback circuit 50 converts the 8 kI-Iz signal to a 1 kHz signal, which is then applied to the phase detector 42 for comparison with the signal from the edge detector.

Figure 4:
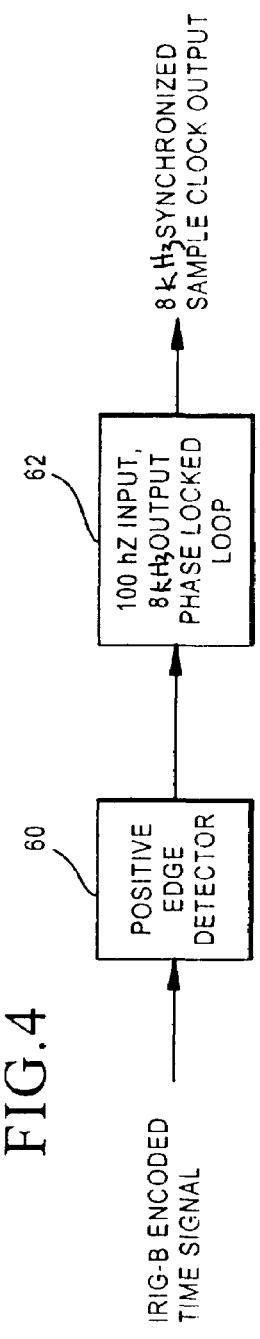
FIG. 4 is a block diagram which is an alternative to the system of FIG. 3.

FIG. 4 shows another embodiment, in a simplified form, in which edge detector 60 responds only to the positive (rising) edges of the IRIG-B encoded time signal input, meaning a pulse every 10 milliseconds, i.e. a 100 Hz signal. The phase-locked-loop 62 in FIG. 4 is designed to lock to a periodic 100 Hz input signal and produce an output data sampling synchronization signal. As long as the phase-locked-loop 62 is designed to produce an output signal with a frequency of an integral multiple of 100 Hz, the output will be data sampling synchronization signals precisely at the beginning of each second and evenly spaced between each successive second at a selected frequency which is a multiple of 100 Hz, i.e. 100 Hz, 200 Hz, 300 Hz, etc.

Thus, a single control signal to a plurality of devices to be synchronized in operation will result in both time-of-day clock synchronization and data sampling synchronization for the plurality of instruments. Again, while in the embodiment shown an IRIG-B encoded time-of-day signal is used, other nonperiodic encoded time signals can be used for synchronization of the data sampling system, i.e. the invention is not limited an IRIG-B signal. Further, the invention is not limited to data acquisition, i.e. data sampling. It could be used for other synchronization functions as well.

It should also be understood that the IRIG-B time signal or other time signal, provided to a single relay or similar device, such as a meter, could be used to provide very accurate sampling signals for that device in addition to providing time-of-day information for reports, etc. In such an arrangement, the relay includes a phase-locked loop which provides an output signal at a specific selected frequency, e.g. 8 kHz. In operation, the data acquisition system for the relay or meter will be phase-locked to the IRIG-B or other time source. If there is no IRIG-B signal available, or if high accuracy is not required (an example of high accuracy requirements is when synchophasors are used in the device), then the internal sampling system in the equipment can be used.

Although a preferred embodiment of the invention has been disclosed for purposes of illustration, it should be understood that various changes modifications and substitutions can be incorporated in the embodiment without departing from the spirit of the invention which is defined by the claims which follow.

What is claimed is:

1. A system for synchronous sampling of analog signal inputs, using an externally generated encoded time signal, comprising:
    an input for receiving said externally generated encoded time signal suitable for ensuring accurate time-of-day clock synchronization, wherein the time signal covers a predetermined time period;
    an edge detector responsive to the encoded time signal to produce a series of pulses based on the edges of the encoded time signal; and
    a phase-locked loop assembly producing an output sampling synchronization signal which is phased-locked to said pulses at the output of the edge detector, such that the output sampling synchronization signal occurs at the beginning of each predetermined time period with successive synchronization signals being evenly spaced in the interval between the beginning of each successive predetermined time.

2. The system of claim 1, wherein the time signal is an IRIG-B time signal.

3. The system of claim 1, wherein the phase-locked-loop is locked at 1 kHz and the output sampling synchronization signal is an integral multiple of 1 kHz.

4. The system of claim 1, wherein the predetermined time period is one second.

5. The system of claim 1, wherein the edge detector detects only rising edges of the encoded time signal and produces an output based thereon.

6. The system of claim 1, wherein the edge detector detects both rising and falling edges of the encoded time signal and produces an output based thereon.

7. The system of claim 1, wherein the encoded time signal includes a bit which identifies the beginning of each frame of the encoded time signal.

8. The system of claim 1, wherein the phase-locked-loop assembly includes a phase detector, a filter responsive to the output of the phase detector and a counter responsive to the output of the filter for producing the output sampling synchronization pulses, and wherein the phase-locked-loop assembly further includes a feedback circuit responsive to the output signal of the counter for feeding back the output signal to the phase detector, which produces an output signal by which the counter is adjusted to lock the sampling synchronization signal to the encoded time signal.

9. A system for synchronous control of a selected operation, using an externally generated encoded time signal, comprising:
   an input for receiving the externally generated encoded time signal, suitable for ensuring accurate time-of-day clock synchronization, wherein the time signal covers a predetermined time period;
   an edge detector responsive to the encoded time signal to produce a series of pulses based on the edges of the encoded time signal; and
   an assembly which produces an output synchronization signal for the selected operation, locked to the output of the edge detector, such that the output sampling synchronization signal occurs at the beginning of each predetermined time period with successive synchronization signals being evenly spaced in the interval between the beginning of each successive predetermined time.

10. The system of claim 9, wherein the time signal is an IRIG-B time signal.

11. The system of claim 9, wherein the assembly is a phase-locked loop.

12. A system for sampling analog signal inputs, using an externally generated encoded time signal, comprising:
   an input for receiving the externally generated encoded time signal, suitable for ensuring accurate time-of-day clock information, wherein the time signal covers a predetermined time period;
   an edge detector responsive to the encoded time signal to produce a series of pulses based on the edges of the encoded time signal; and
   a phase-locked loop assembly which produces an output sampling signal which is phase-locked to the output-of the edge detector, such that the output sampling synchronization signal occurs at the beginning of each predetermined time period with successive sampling signals being evenly spaced in the interval between the beginning of each successive predetermined time.

13. The system of claim 12, wherein the time signal is an IRIG-B time signal.

* * * * *